United States Patent [19]

Dorman et al.

[11] Patent Number: 4,694,474
[45] Date of Patent: Sep. 15, 1987

[54] HIGH SPEED COUNTER FOR THIN OBJECTS

[75] Inventors: Richard A. Dorman, Troy; Robert E. Johnson, Ballston Spa, both of N.Y.

[73] Assignee: Mechanical Technology Incorporated, Latham, N.Y.

[21] Appl. No.: 875,554

[22] Filed: Jun. 18, 1986

[51] Int. Cl.[4] .................. H03K 21/40; G06M 7/00
[52] U.S. Cl. ................................ 377/6; 377/112; 377/30
[58] Field of Search .............................. 377/6, 112, 30

[56] References Cited

U.S. PATENT DOCUMENTS

| | | | |
|---|---|---|---|
| 3,441,719 | 4/1969 | Haller et al. | 377/6 |
| 4,081,661 | 3/1978 | Durbin | 377/6 |
| 4,139,766 | 2/1979 | Conway | 377/6 |
| 4,528,680 | 7/1985 | Archambeault | 377/6 |
| 4,580,280 | 4/1986 | Hetrick | 377/6 |

Primary Examiner—John S. Heyman
Attorney, Agent, or Firm—Joseph V. Claeys; Joseph C. Sullivan

[57] ABSTRACT

A device for counting objects in a stacked relationship which includes a bifurcated optical cable, a light source for directing light through the bundle at the stack and a sensor for generating a signal proportional to the light reflected by the stack. The signal is digitized and fed to a digital counter. Various displays connected to the counter indicate the count results.

2 Claims, 6 Drawing Figures

CAN END COUNTING SYSTEM

HIGH SPEED COUNTER FOR THIN OBJECTS

BACKGROUND OF THE INVENTION

1. Field of Invention

This invention pertains to a device for counting relatively flat and thin objects such as can ends as they pass by a sensor in a stacked relationship and, more particularly, to a device which counts said objects by making use of reflected light therefrom.

2. Description of the Prior Art

Frequently a plurality of thin objects such as ends for beverage cans, are arranged in a stacked relationship immediately after their manufacture. While various schemes have been proposed in the past, presently there is no system or device available that can be used to count the number of objects in each stack accurately.

OBJECTIVES AND SUMMARY OF THE INVENTION

In view of the above, it is an objective of the present invention to provide a counter which can determine the number of objects, and in particular flat and thin objects, in a stack, quickly and accurately.

Another objective is to provide a counter which can be mounted on/or adjacent to an existing manufacturing station.

A further objective is to provide a counter which is relatively inexpensive and is made up of readily available components.

Other objectives and advantages of the invention shall become apparent from the following description of the invention. A device according to this invention for counting flat objects such as can ends comprises a bifurcated bundle of optical fibers having a receiver arm and a transmitter arm. A light source introduces light into one end of the transmitter arm which has its opposite end positioned to direct light toward the edges of the objects to be counted. The corresponding light reflected from the objects passes through the receiver arm to a light sensor which translates it into corresponding electrical signals. The electrical signals are amplified and sent to a signal digitizer which generates a pulse for each detected object. The pulses from the digitizer are fed to a summary counter. The counter drives one or more display means for displaying the count.

DETAILED DESCRIPTION OF THE INVENTION

Figure 1:
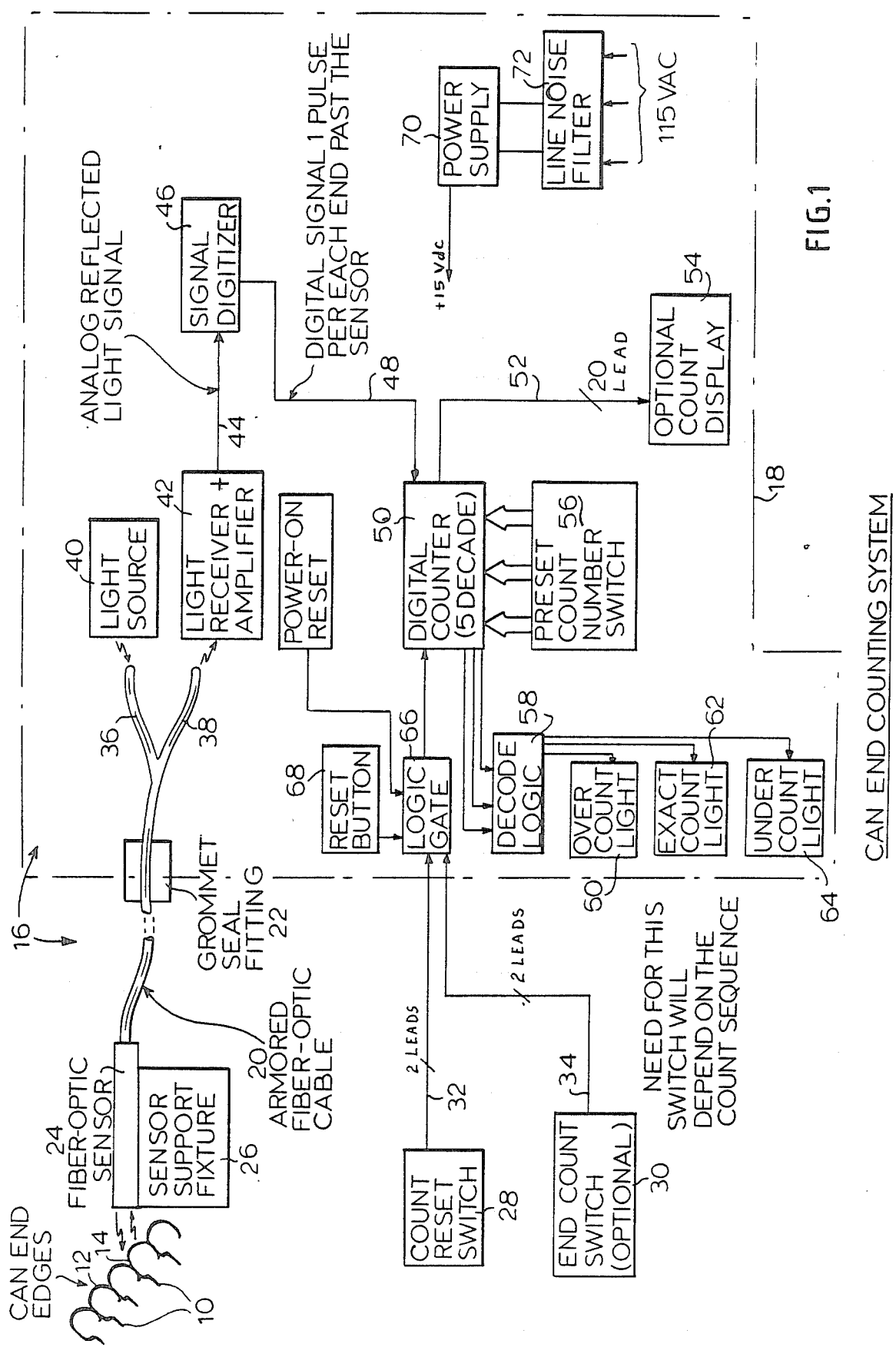
FIG. 1 shows the elements of a device for counting objects constructed in accordance with the invention.

An embodiment of the invention is shown in FIG. 1 by way of illustration. As shown in this figure, a plurality of objects, such as, can ends 10 are stacked so that their edges form a pattern of alternating peaks 12 and valleys 14. The can end counter device 16 includes a plurality of components disposed in an enclosure 18 which may be mounted anywhere in the vicinity of an assembly line producing the objects 10. The closure is preferably sealed air tight to protect the components contained therein. An armored fiber-optic cable 20 passes out of the enclosure through a grommet and seal fitting assembly 22. The cable 20 which may have a length of about 20 feet is terminated in a fiber-optic sensor 24 mounted on a sensor support fixture 26. The device has two other components which are disposed outside enclosure 18: a count reset switch 28 and an optional end count switch 30. These switches are preferably momentary switches and are connected to the enclosure 18 by electrical cables 32 and 34 respectively, each preferably comprising two wires. Switches 32 and 34 are positioned near an operation station for controlling the counter operation as described more fully below.

Inside enclosure 18, cable 20 is bifurcated into a transmitter arm 36 and a receiver arm 38. Transmitter arm 36 receives light from a light source 40 and directs the light toward the edges of can ends 10. The light reflected by the can ends passes through the receiver fibers of arm 38 to a light receiver and amplifier 42. From amplifier 42 an analog electric signal proportional to the intensity of the light reflected by the can ends is sent on line 44 to a digitizer 46. Digitizer 46 detects the peaks and valleys 12, 14 formed by the can end edges and for each peak and valley pair it generates a digital pulse on line 48. To eliminate error signals, the digitizer is prevented from generating another pulse before a valley is detected.

The pulse on line 48 are totaled by a five decade counter 50. The count generated by the counter may be fed on line 52 to a direct count display 54. This option is particularly useful when the assembly line and/or the counting device is first set up to determine the actual can end count in a run, or over a period of time.

There is also provided a preset count switch 56 on which a five digit number can be manually preset. The count in counter 50 is compared to the preset number by a decoder logic circuit 58. At the end of each counting operation, the logic circuit 58 activates an over count light 60, an exact count light 62 or an under count light 64 to indicate that the count generated by counter 50 exceeds, is equal to or is below the number in preset switch 56, respectively.

Counter 50 is reset by logic gate 66. The logic gate may be triggered by a reset push-button 68 mounted on the enclosure 18 or the count reset switch 28. A signal from end count switch 30 is used to indicate to the counter to stop counting and display the count results on display 54 and/or lights 60, 62 or 64. This switch is particularly useful for detecting overcounts.

Enclosure 18 above includes a power supply 70 which provides the proper voltage (i.e. +15 vdc) for the various analog and digital components of the device. The power supply is coupled to a standard 115 vac source through a filter 72.

Figure 2:
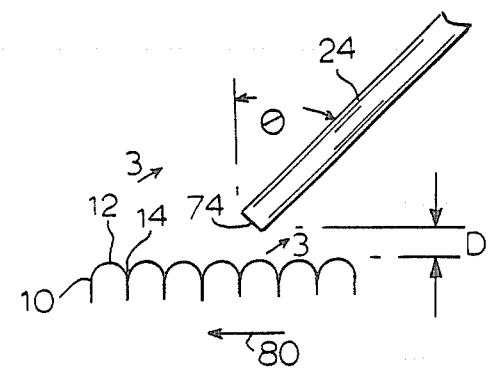
FIG. 2 shows the manner in which light is projected on the objects by the device of FIG. 1.
Figure 3:
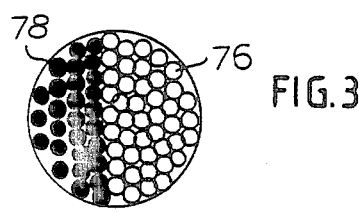
FIG. 3 shows an end view of the optical fiber bundle used in the device of FIG. 1.
Figure 4:
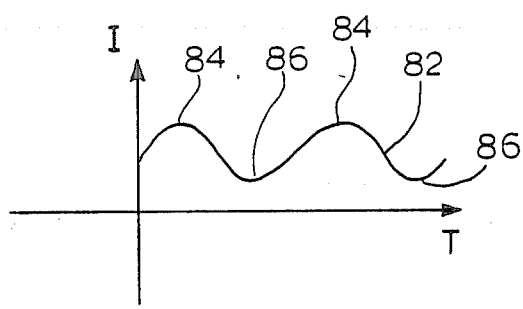
FIG. 4 shows a graph of the reflected light intensity detected by the device of FIG. 1 as a function of time.

The relative arrangement between the sensor 24 and can ends 10 is shown in FIG. 2. The sensor is separated from the can ends by a distance D of about 0.050 inches, and is disposed at an angle $\theta$ which is about 30 degrees from the vertical. The sensor has a hemispherical face 74. Viewed from the end, as shown in FIG. 3, it can be seen that the fibers which make up the bundle comprise transmit fibers 76 and receive fibers 78, each arranged in a semi-circle. Because of this arrangement the intensity of the light reflected by the ends as they move past the sensor in the direction of arrow 80, is generally sinusoidal as shown in FIG. 4. The peaks 84 of wave 82 in FIG. 4 correspond to the peaks 12 while the valleys 86 correspond to the valleys 14 of the can ends. The actual amplitudes 84, 86 depend on the surface finish and the color of the can ends.

Figure 5:
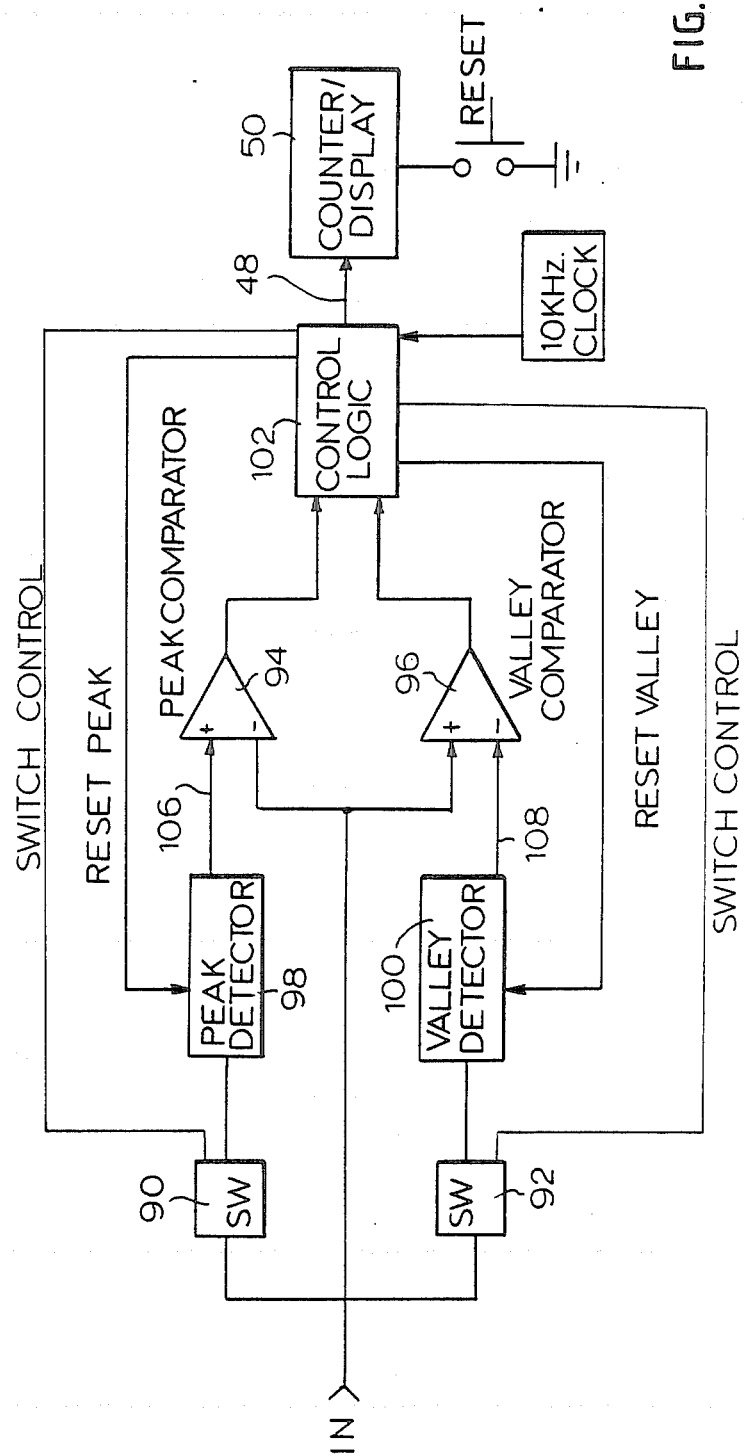
FIG. 5 shows details of the signal digitizer of the device of FIG. 1.

The sinusoidal wave 82 is fed (after amplification) to digitizer 46. Details of the digitizer are shown in FIG. 5. In the digitizer 46 the input wave is fed simultaneously to two switches 90, 92 and two comparators 94 and 96. Comparator 94 cooperates with switch 90 and a peak detector 98 to detect peaks 84. Similarly, comparator 96 cooperates with switch 92 and a valley detector 100 to detect valleys 86.

The outputs of comparators 94, 96 are fed to a logic circuit 102 which generates a pulse for counter 50 for each detected peak. A 10 KHz clock generator generates clock signals for the logic circuit.

Figure 6:
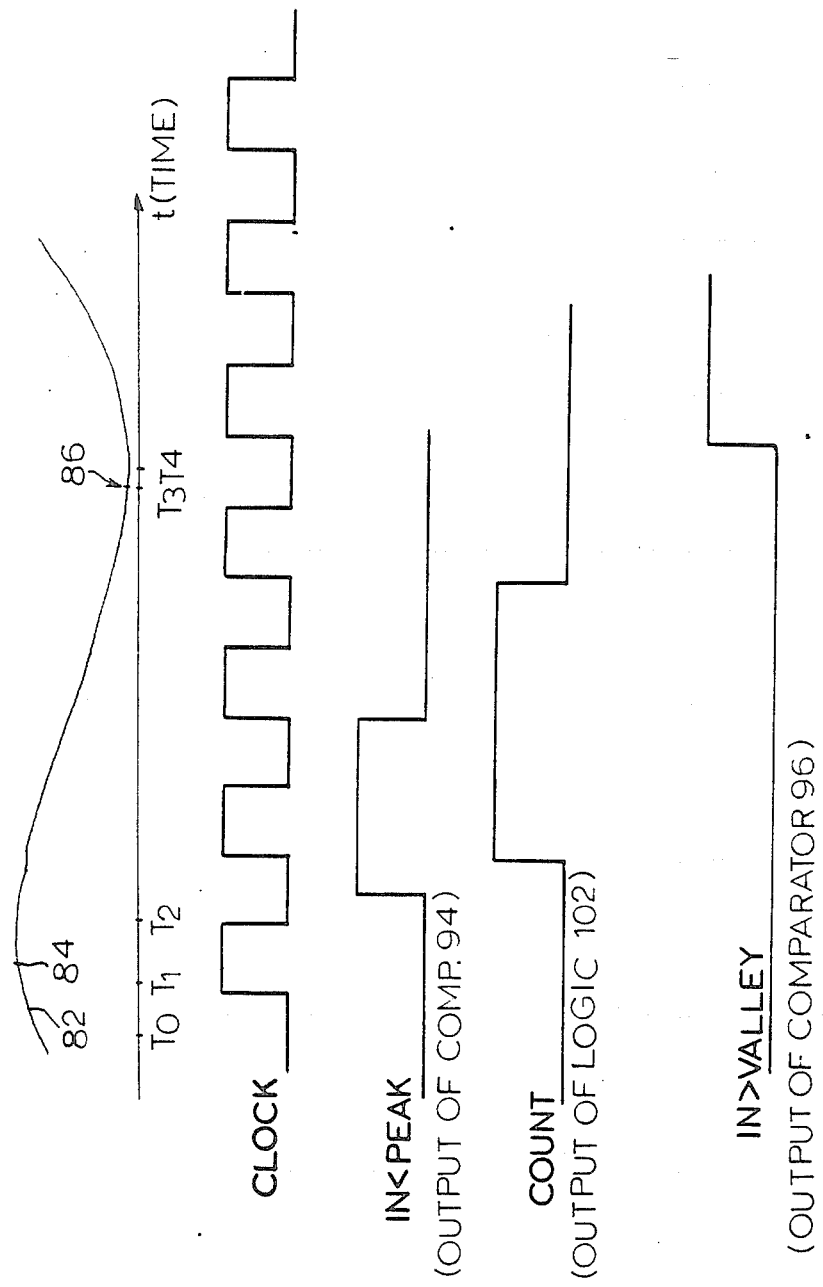
FIG. 6 shows various wave shapes describing the operation of the digitizer of FIG. 5.

The operation of the digitizer 46 in FIG. 5 is discussed below in conjunction with the waveforms shown in FIG. 6. Initially at t=T0, wave 82 is rising, switch 90 is closed and switch 92 is opened. Peak detector 98 tracks wave 82 and generates an output on line 106 which is about one diode drop (approximately 0.6 volts) below wave 82. At t=T1, wave 82 reaches its peak 84 and therefore after T1 it starts falling towards its valley. However, after T1, detector 98 maintains the output reached at T1. At t=T2 wave 82 drops below its peak by one diode drop. Comparator 94 has its non-inverting input (+) connected to comparator 94 while its inverting input (−) is connected to input line 44. Therefore, at T2 the output of comparator 94 goes high. In response, control logic circuit 102 generates a pulse on line 48 for two clock periods.

Meanwhile, sometime after T2 and before T3 logic circuit 102 turns switch 90 off and switch 92 on. As wave 82 falls detector 100 tracks the wave and generates a voltage level on line 108 which is about a diode voltage drop higher than wave 82. At t=T3 wave 82 reaches its valley 86. After T3 wave 82 starts rising again, however detector 100 maintains its output at the level attained at T3. At T4 wave 82 exceeds its valley by a diode voltage drop and therefore, the output of comparator 96 goes high. This signal indicates to the logic circuit 102 that a valley has been detected. In response, the logic circuit resets the detectors 98, 100 and flip switches 90 and 92 to the on and off positions respectively and therefore the digitizer circuit is again ready for a next peak on wave 82. Detectors 98, 100 could be diode/capacitor detectors or high speed sample-and-hold circuits.

The invention has been described with respect to the counting of can ends. Obviously, the device could be used for counting other stacked objects as long as a variation in the reflected light is perceivable as the objects pass the sensor. Importantly, the device depends on the presence of peaks and valleys in the signal and not obsolute reflected light levels and therefore the same device can be used to count objects having different reflectivity or color (as mentioned above) without the necessity for recalibration.

Obviously, numerous modifications may be made to the invention without departing from its scope as described in the appended claims.

What is claimed is:

1. A device for counting objects arranged in a stack which are differentiable by light reflectance, comprising:
   a bifurcated fiber optic bundle having a transmitter arm and a receiver arm terminating in a bundle face for directing light toward said stack and for receiving corresponding reflected light from the stack;
   a light source coupled to said transmitter arm;
   a light sensor coupled to said receiver arm for generating an electrical signal corresponding to light reflected by said stack; and
   counting means for receiving said electrical signal and generating a count corresponding to the number of objects in the stock;
   where said counting means comprises a digitizer circuit for generating a pulse corresponding to a peak value of said electrical signal and a digital counter for totalizing said pulse and wherein said electrical signal is characterized by alternating peaks and valleys corresponding to said objects, and said digitizer comprises peak detecting means and valley detecting means, said peak detecting means being disabled after a pulse is emitted until a valley is detected by the valley detecting means such that false counts are prevented.

2. A device for counting objects arranged in a stack which are differentiable by light reflectance, comprising:
   a bifurcated fiber optic bundle having a transmitter arm and a receiver arm terminating in a bundle face for directing light toward said stack and for receiving corresponding reflecting light from the stack;
   a light source coupled to said transmitter arm;
   a light sensor coupled to said receiver arm for generating an electrical signal corresponding to light reflected by said stack; and
   counting means for receiving said electrical signal and generating a count corresponding to the number of objects in the stack and further comprising display means for displaying information indicative of said count; and
   further comprising a logic circuit coupled to said counting means, a count preset means connected to said counting means for providing a preset number and a plurality of lights connected to said logic circuit and selectively activated by said logic circuit when said preset number is equal to, exceeds, and is below said count and an end count switch connected to said logic circuit to stop said counting means from further counting and display the end count on said display means and/or activate the exceed light of plurality of lights.

* * * * *